US010762968B2

(12) United States Patent
Cadloni et al.

(10) Patent No.: US 10,762,968 B2
(45) Date of Patent: Sep. 1, 2020

(54) DYNAMIC USER-SELECTABLE TRIM PROFILE IN A MEMORY COMPONENT

(71) Applicant: Micron Technology, Inc., Boise, ID (US)

(72) Inventors: Gerald L. Cadloni, Longmont, CO (US); Michael Sheperek, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/128,905

(22) Filed: Sep. 12, 2018

(65) Prior Publication Data

US 2020/0082887 A1 Mar. 12, 2020

(51) Int. Cl.
G06F 12/00 (2006.01)
G11C 16/16 (2006.01)
G06F 12/02 (2006.01)
G11C 8/06 (2006.01)

(52) U.S. Cl.
CPC .......... *G11C 16/16* (2013.01); *G06F 12/0246* (2013.01); *G06F 12/0253* (2013.01); *G11C 8/06* (2013.01)

(58) Field of Classification Search
CPC ....... G11C 16/16; G11C 8/06; G06F 12/0246; G06F 12/0253
See application file for complete search history.

(56) References Cited

U.S. PATENT DOCUMENTS

| | | | | |
|---|---|---|---|---|
| 7,313,684 B2 * | 12/2007 | O'Connell | ............ | G06F 9/4418 713/100 |
| 7,463,520 B2 * | 12/2008 | Aritome | .................. | G11C 16/10 365/185.12 |
| 7,490,217 B2 * | 2/2009 | Tremaine | ............ | G06F 12/0215 711/207 |
| 7,707,368 B2 * | 4/2010 | Louie | .................... | G11C 29/028 365/185.22 |
| 7,826,265 B2 * | 11/2010 | Aritome | .................. | G11C 16/10 365/185.12 |
| 7,870,197 B2 * | 1/2011 | Lewis | ............... | H04L 29/06027 709/206 |
| 7,920,427 B2 * | 4/2011 | Marquart | ............... | G11C 16/16 365/185.19 |
| 8,199,585 B2 * | 6/2012 | Marquart | ............... | G11C 16/16 365/185.19 |
| 9,007,867 B2 * | 4/2015 | Hawes | ................... | G11C 16/20 365/189.09 |
| 9,257,182 B2 * | 2/2016 | Grunzke | ................ | G11C 16/06 |
| 9,507,605 B1 * | 11/2016 | Bombacino | ............... | G06F 8/65 |
| 10,566,063 B2 * | 2/2020 | Sheperek | .............. | G06F 3/0604 |
| 2014/0241097 A1 * | 8/2014 | Hawes | ................... | G11C 16/20 365/230.01 |

* cited by examiner

*Primary Examiner* — Daniel D Tsui
(74) *Attorney, Agent, or Firm* — Perkins Coie LLP

(57) ABSTRACT

A memory component includes a memory configured to store an updatable trim profile that is user-modifiable. The updatable trim profile includes address information corresponding to a trim register to be modified, command information corresponding to an action to be performed, and data corresponding to the action to be performed. A processing device that is coupled to the memory component is configured to receive an instruction to modify the trim register, read contents of the updatable trim profile, and modify the trim register based on the address information, the action to be performed on the trim register, and the data.

20 Claims, 5 Drawing Sheets

DYNAMIC USER-SELECTABLE TRIM PROFILE IN A MEMORY COMPONENT

TECHNICAL FIELD

Embodiments of the disclosure generally relate to memory sub-systems, and more specifically, relate to a dynamic user-selectable trim profile in a memory component of a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
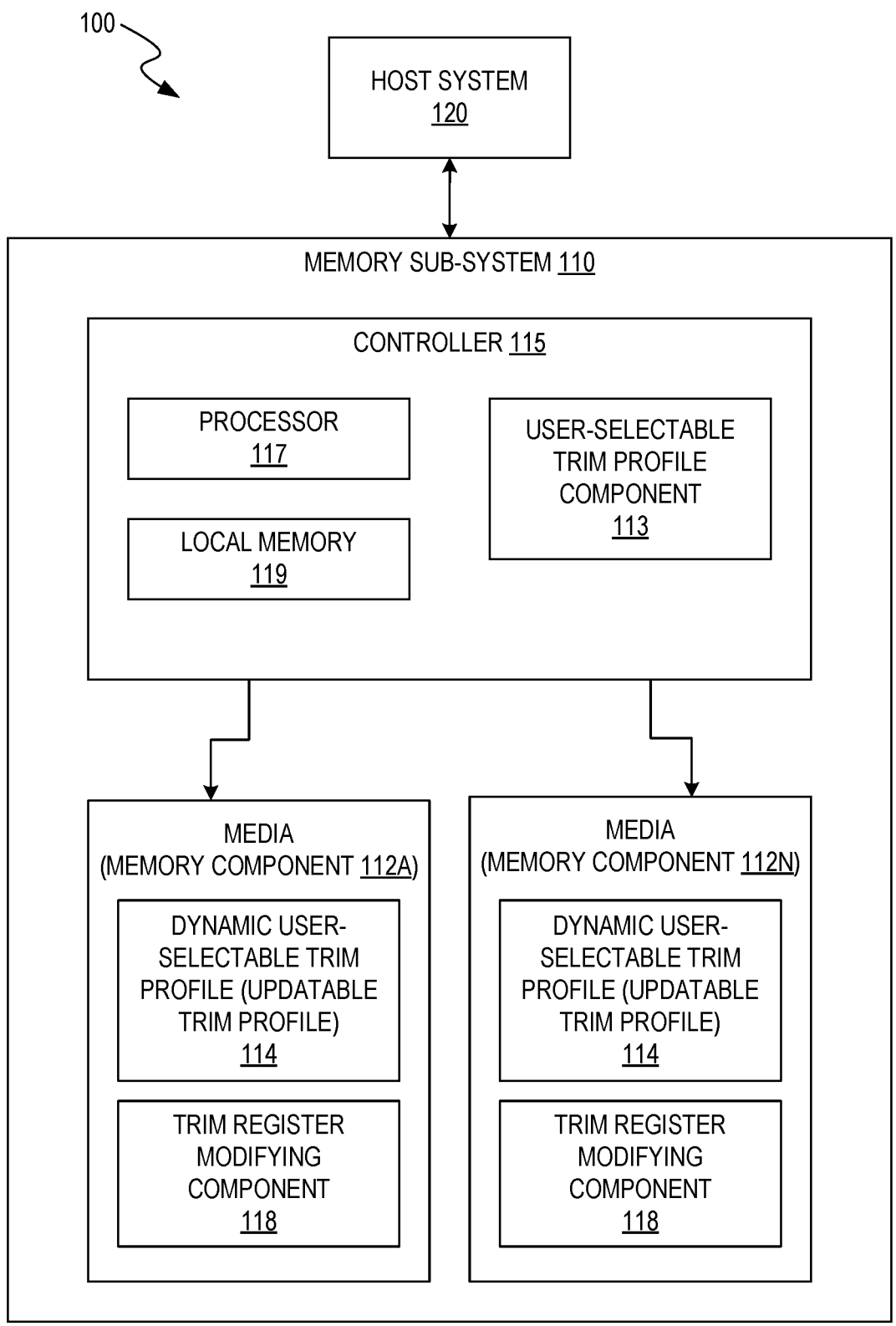
FIG. 1 illustrates an example computing environment that includes a memory sub-system in accordance with some embodiments of the present disclosure.

Aspects of the present disclosure are directed to providing a dynamic user-selectable trim profile in a memory sub-system to customize operation of the memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system using write (also hereinafter referred to as "program") requests and can retrieve data from the memory sub-system using read requests. In some embodiments, the memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory.

Memory components, such as flash based memory, can be optimized for particular applications. For example, a memory component can be optimized for a mass-storage application, a mobile communication application, a desktop computing application, etc. The memory components can be optimized by initializing or overwriting the trim registers in the memory component to desired values. If the memory components are not optimized for the particular application, operation of the memory sub-system can be unreliable and/or have performance issues.

A conventional memory sub-system can initialize trim registers in one or more memory components based on manufacture-configured trims (also referred to as "protected trims") when initializing one or more trim registers of the memory component during boot operations after power-on or a reset of the memory sub-system (or a component thereof). The protected trims allow for the memory component to have limited customization capabilities. For example, the trim registers of the memory component can be initialized to customize the memory component for a specific use in a particular application, such as, for example, a mobile device, a desktop device, or some other use. However, the protected trims are part of firmware and require complex procedures and extensive testing at the manufacturing facility to set up, which means that the protected trims are not field-updatable. Further, there are a limited number of protected trims in a memory component. Due to the limited number of protected trims and the inability to update them, compromises may need to be made with respect to the configuration of the memory component. For example, protected trims optimized for use in a mobile device may need to be used for a digital camera because the optimized mobile device trims are the closest match. Such compromises can lead to poor or less than desired performance and/or reliability of the memory component once the memory sub-system is placed in service. To account for the limited configuration options, in a conventional memory sub-system, the controller (e.g., a SSD controller) and/or the host system may update appropriate trim registers in the memory components after the boot operation has been completed to further customize the memory component before the memory sub-system is placed in normal operation. However, in conventional memory sub-systems, there can be thousands of trim registers that may need to be updated. Because the commands to update these trim registers are transmitted to the memory components through the controller's and/or host system's communication interface, there can be a substantial delay before the memory sub-system is placed in service for normal operations. This delay will likely increase as modern memory sub-systems increase the memory densities of memory components and thousands of additional trim registers will need to be customized.

Aspects of the present disclosure address the above and other deficiencies by incorporating into the memory sub-system one or more dynamic (updatable) user selectable trim profiles that can be used to modify the corresponding trim registers. As used herein, "modify" a trim register means "initialize and/or update" a value in the trim register. Each trim profile can include a packet of information that identifies the address location of the trim register to be modified and the desired modification to be performed on the trim register. The dynamic user selected trim profile can be initiated during boot operations and/or immediately after boot operations (e.g., an operation after the boot operation but prior to normal or in-service operation) to modify the corresponding trim register. In some embodiments, the dynamic user selected trim profile can be initiated during normal or in-service operation. In some embodiments, one or more dynamic user selected trim profiles can be stored in one or more data-structures (e.g., tables) in the memory component.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fiber Channel, Serial Attached SCSI (SAS), etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory components 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs), multi-level cells (MLCs) (e.g., triple level cells (TLCs), or quad-level cells (QLCs)). In some embodiments, a particular memory component can include both an SLC memory portion and a MLC memory portion. Each of the memory cells can store one or more bits of data (e.g., data blocks) used by the host system 120. Although non-volatile memory devices such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The memory system controller 115 (hereinafter referred to as "controller") can communicate with the memory devices 112A to 112N to perform operations such as reading data, writing data, or erasing data at the memory devices 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N. Each of the memory components 112A to 112N can include one or more dies.

The memory sub-system 110 includes a dynamic user-selectable trim profile (also referred to herein as "updatable trim profile") 114 that includes information for modifying trim registers in one or more memory components 112A to 112N. In some embodiments, the memory sub-system 110 can include a user-selectable trim profile (USTP) component 113 to initiate a trim profile operation that modifies one or more trim registers in a memory component 112A to 112N based on information in the corresponding updatable trim profile 114. In some embodiments, the controller 115 includes at least a portion of the USTP component 113. For example, the controller 115 can include a processor 117 (processing device) configured to execute instructions stored in local memory 119 for performing the operations described herein. In some embodiments, the USTP component 113 is part of the host system 110, an application, or an operating system.

In some embodiments, one or more of the memory components 112A to 112N can include a trim register modifying component 118 that performs a trim profile operation to modify the trim registers based on the information in the corresponding updatable trim profile 114. For example, each trim register modifying component 118 can receive an instruction from, for example, the USTP component 113 (or another operation) to initiate a respective trim profile operation. The trim profile operation modifies the appropriate trim register(s) in the respective memory component 112A to 112N based on information in the corresponding updatable trim profile 114. The USTP component 113 (or another operation) can initiate the trim profile operations sequentially or in parallel (or some combination thereof) in the memory components 112A to 112N. That is, all the memory components can be updated in parallel, only one memory component at a time is updated, or some memory components are updated in parallel and other memory components are updated after others are done updating.

The memory sub-system 110 can include multiple sets of updatable trim profiles 114 with each set corresponding to different configurations for the memory components 112A to 112N. For example, one set of updatable trim profiles 114 can be for optimizing read operations while another set can be for optimizing program operations. In some embodiments, one or more sets of updateable trim profiles 114 can be configured for emergency, critical, and/or recovery operations that can be, for example, initiated by the manufacturer or end-user to correct or enhance operation of the memory components 112A to 112N. The memory sub-system 110 can include any number of updatable trim profiles 114 depending on the memory size. In some embodiments, the initiate instruction from the USTP component 113 (or another operation) can include information identifying the specific updateable trim profile (or profiles) 114 to use when updating the trim registers. For example, the initiate instruction can include the address where the updatable trim profile (or profiles) 114 is stored. In some embodiments, a group of updatable trim profiles 114 can be stored in a data-structure, such as, for example, a table, and the initiate instruction from the USTP component 113 (or another operation) can include information identifying the table. For example, the initiate instruction can include the starting address of a data-structure (e.g., table) storing the multiple updatable trim profiles 114 is stored. Once the trim register modifying component 118 receives the instruction, the trim profile operation begins at the starting address of the data-structure. In some embodiments, an end address is also transmitted to the trim register modifying component 118 as part of the initiate instruction. In some embodiments, a stop command is stored in an updatable trim profile 114 to stop execution of the trim register modifying component 118 and/or the USTP component 113. In some embodiments, after completion of the trim profile operation, the trim register modifying component 118 can transmit information back to the USTP component 113 (or another operation that initiated the trim profile operation). The information can include status information on the success of the trim profile operation, such as, for example, an error count with respect to read and/or program errors when performing read and/or write operations. In some embodiments, the received error count can be used to initiate calibration operations (e.g., read calibration operations, program calibration, operations, etc.) if needed.

In some embodiments, a trim profile operation of the trim register modifying component 118 can be initiated (e.g., via USTP component 113 or another operation) as part of the boot operation of the memory sub-system 110 at, for example, power on and/or reset of the memory sub-system 110 (or a component thereof). In some embodiments, the trim profile operation can be initiated after the boot operation has been completed, but before the normal (in-service) operation of the memory sub-system 110 has started.

In some embodiments, one or more trim profile operations can be initiated during normal operation of the sub-system 110 in response to a manual (user-initiated) request and/or an automated request based on, for example, a change in the operation of the memory sub-system and/or a request to change the configuration of the memory sub-system 110. For example, if the host system 120 expects to store large amounts of streamed data (e.g., video files), the trim register modifying component 118 can be initiated (e.g., via USTP component 113 or another operation) to optimize for program operations in one or more memory components 112A to 112N. After the store operation is completed, the trim register modifying component 118 can be initiated (e.g., via USTP component 113 or another operation) to optimize for read operations or for a balanced optimization between program and read operations in one or more memory components 112A to 112N.

In some embodiments, all trim register updates for a memory component 112N can be done as part of a single trim profile operation, for example, prior to and/or after normal operation of the memory sub-system 110. In some embodiments, multiple instructions can be sent (e.g., via USTP component 113 or another operation) to initiate multiple trim profile operations, for example, prior to and/or after prior to normal operation of the memory sub-system 110. The multiple trim profiles can allow for separate and multiple trim profile operation scenarios that can be appropriately spaced to reduce or optimize the trim register modification time and/or the power on time of the system (e.g., reduce or optimize the boot up time and/or time between boot up and start of normal operation). In some embodiments, an update sequence of the updatable trim profiles 114 and/or an update time of one or more updatable trim profiles 114 (e.g., the time when trim profile operation executes the updatable trim profile 114) can be controlled to reduce or optimize the trim register modification time and/or the power on time of the system (e.g., reduce or optimize the boot up time and/or time between boot up and start of normal operation).

In some embodiments, a trim profile operation can be initiated (e.g., by the USTP component 113 or another operation) after the protected trims have been used by the memory components 112A to 112N to initialize the corresponding trim registers. In some embodiments, the trim profile operation can further modify at least a portion of the trim registers initialized by the protected trims. By using both the updatable trim profiles 114 and the protected trims, the memory sub-system 110 can be optimized for any application (e.g., mobile devices, desktop devices, camera devices, streaming video, etc.) without having to compromise on the configuration of the memory components 112A to 112N. In addition, extensive testing of the configurations such as that performed by the manufacturer on the protected trims is not required, especially if the updatable trim profiles 114 are stored in SLC memory.

In some embodiments, the updatable trim profile 114 can be dynamically modified by the memory sub-system 110 and/or the host system 120 during normal operation. In some embodiments, the updatable trim profile 114 can be modified based on updated trim values corresponding to calibration operations and/or changes in the memory component due to use and/or age. For example, the values in trim registers corresponding to threshold voltages used in memory operations (e.g., read, program, etc.) can be updated based on results of calibration operations (e.g., read level calibrations, program level calibrations, etc.). The updated trim values in the trim registers (e.g., post-calibration) can be transferred to corresponding updatable trim profiles 114 during normal or in-service operation. The transfers can occur periodically, manually (e.g., user-initiated), as part of a shut-down sequence of the memory sub-system 110, automatically based on predetermined criteria (e.g., after a calibration operation), or any combination thereof. In some embodiments, the memory sub-system 110 can modify the updatable trim profiles 114 with the updated trim values in the trim registers (e.g., post-calibration) when the memory sub-system 110 is in an idle period with respect to the running workload. By modifying the updatable trim profiles 114 with the updated trim values, the memory sub-system 110 does not rely on instructions transmitted across the communication interface between the controller 115/host system 120 and the memory components 112A to 112N, which means that the memory sub-system 110 can quickly update the memory components 112A to 112N the next time the memory sub-system 110 goes through a power up or reset operation, for example. Further details with regards to the operations of the USTP component 113, the operation of trim register modifying component 118, and updatable trim profile 114 are described below.

Figure 2:
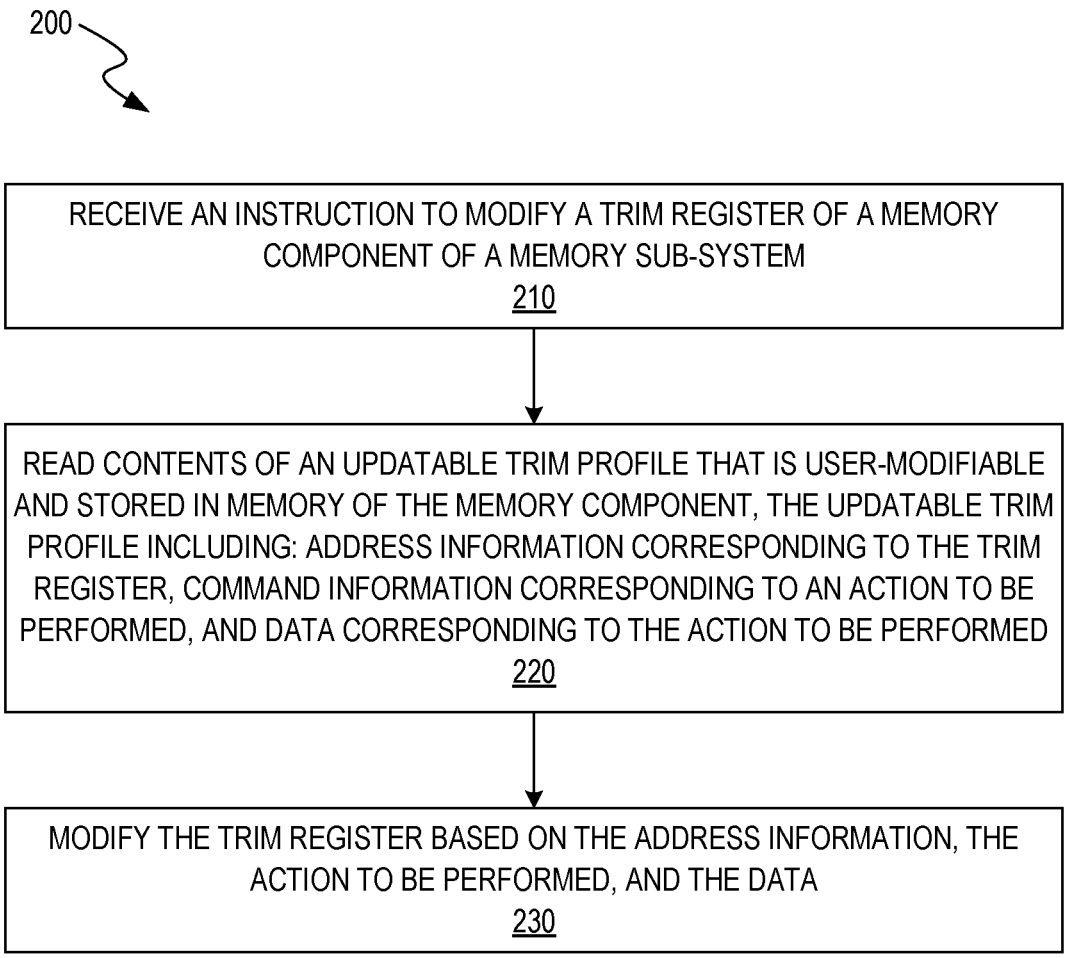
FIG. 2 is a flow diagram of an example method to modify trim registers in a memory component, in accordance with some embodiments of the present disclosure.

FIG. 2 is a flow diagram illustrating example method 200 for managing the modification of one or more trim registers in the memory sub-system 110. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 can be initiated by the USTP component 113 of FIG. 1 and the method 200 can be performed by one or more trim register modifying components 118. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing device (e.g., one more processors in corresponding memory component 112A to 112N) receives an instruction (e.g., from USTP 113 or another operation) to modify a trim register of a memory component (e.g., memory component 112A to 112N) of a memory sub-system (e.g., memory sub-system 110).

At block 220, the processing device (e.g., one more processors in corresponding memory component 112A to 112N) reads the contents of an updatable trim profile (e.g., updatable trim profile 114) that is user-modifiable and stored in memory of the memory component (e.g., memory component 112A to 112N). The updatable trim profile (e.g., updatable trim profile 114) can include address information corresponding to a trim register to be modified. The updatable trim profile (e.g., updatable trim profile 114) can also include command information corresponding to an action to be performed and data corresponding to the action to be performed. For example, in some embodiments, the action to be performed can be an overwrite operation, a bitwise logical OR operation, a bitwise logical AND operation, and/or an action related to operation of the trim profile operation (e.g., stop operation). The bitwise operations can be performed on trim registers in the memory sub-system 110 that use one or more individual bits of a trim register for configuring a memory component (e.g., memory components 112A to 112N). For example, bit 3 in a "bitwise trim register" can correspond to whether temperature compensation should be used in memory operations (e.g., read, program, etc.) on the memory component threshold values and bit 5 of that bitwise trim register can correspond to whether the threshold voltage corresponding to a program distribution (e.g., level 7 in TLC memory) should be adjusted as part of a calibration operation. By using bitwise trim registers and the corresponding bitwise operations, the memory component (e.g., memory components 112A to 112N) can save memory resources by using the same trim register for storing different configurations. The setting (OR) and/or resetting (AND) operations in the example embodiments allow for one or more individual bits in these bitwise trim registers to be changed without changing the original values of the other bits in the bitwise trim registers.

At block 230, the processing device (e.g., one more processors in corresponding memory component 112A to 112N) modifies the trim register based on the address information, the action to be performed, and the data. The trim registers and/or the updatable trim profiles 114 can be located in memory cells (e.g., a page, a block, a die, etc.) of one or more memory components 112A to 112N.

Figure 3:
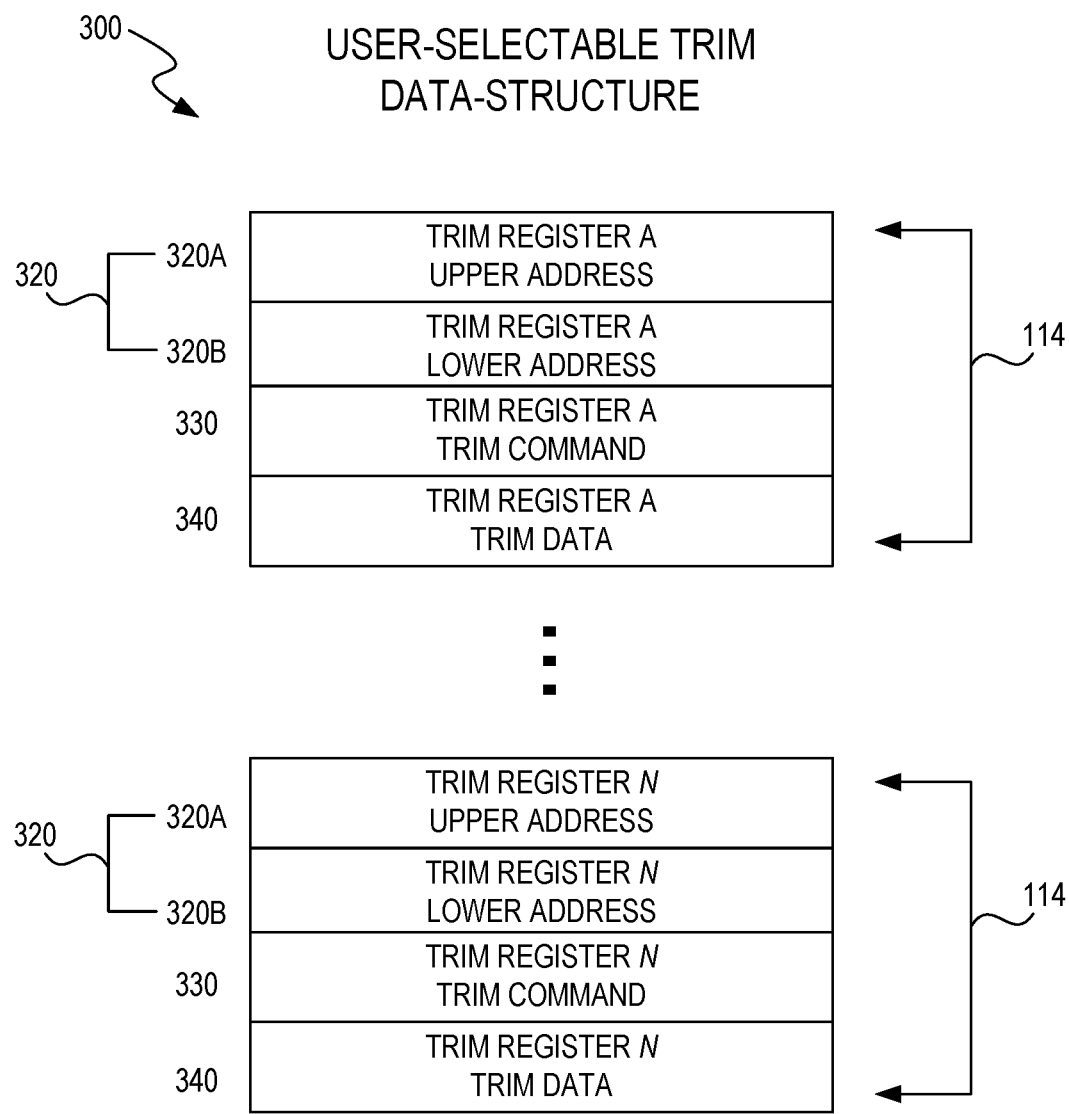
FIG. 3 illustrates an example user-selectable trim data-structure, in accordance with some embodiments of the present disclosure.

FIG. 3 illustrates an example of user-selectable trim data-structure, such as, for example, a table, that stores one or more updatable trim profiles 114. The user-selectable trim data-structure (also referred to herein as "updatable trim profile table") 300 can include one or more updatable trim profiles 114 that correspond to trim registers A to N. In some embodiments, the updateable trim profile 114 includes an address field 320 that includes the address of the trim register to be modified, a command field 330 that includes information on the action to be performed, and a data field 340 that includes the data used in the action to be performed. Each of the fields 320, 330, and 340 can be one or more bytes in length depending on the amount of information that needs to be transmitted. For example, in some embodiments, the address field 320 can include two bytes where a first byte includes an upper address 320A of the trim register A to N and a lower address 320B of the trim register A to N. Each data field 340 includes data needed by the command action for modifying the trim registers A to N. The data can include bit information for bitwise operations and/or values that, for example, can be used for overwriting the corresponding trim register. For a stop action or command, discussed below, no data is required. The command field 330 can be one byte in length and include information on one or more requested actions to be processed on the trim register A to N by the trim register modifying component 118. For example, as discussed further below, the command field 330 can include information to overwrite the trim register A to N, information to logically OR the data in trim register A to N with the data in data field 340 and then overwrite trim register A to N with the logical OR result, information to logically AND the data in trim register A to N with the data in data field 340 and then overwrite the trim register A to N with the logical AND result, and/or information to perform an action without modifying trim register A to N (e.g., a stop action directed to an operation of the USTP component 113 and/or trim register modifying component 118).

In some embodiments, the update order or sequence of the updatable trim profiles 114 in the updatable trim profile table 300 can be controlled to reduce or optimize the time needed for modifying the trim registers. In some embodiments, the update time of one or more updatable trim profiles 114 (e.g., the time when trim profile operation executes the updatable trim profile 114) can be controlled to reduce or optimize the time needed to modify the trim registers. For example, the update sequence of the updatable trim profiles 114 and/or the update time for one or more of the updatable trim profiles 114 can be controlled to reduce or optimize the trim register modification time and/or the power on time of the system (e.g., reduce or optimize the boot up time and/or time between boot up and start of normal operation).

When initiated, for example as part of a boot operation or after a boot operation by the USTP component 113 (or other operation), the trim register modifying component 118 of the respective memory component 112A to 112N reads the values in the updatable trim profile 114 and executes the action stored in the command field 330. In some embodiments, the trim register modifying component 118 can receive information on the start address and/or the end address the updateable trim profile table 300 and/or receive the number of updatable trim profiles 114 that are stored in the updateable trim profile table 300. In some embodiments, the trim register modifying component 118 can receive information corresponding to the start address and sequentially execute the actions in command field 330 in each updatable trim profile 114 until the trim register modifying component 118 receives a command to stop. In some embodiments, one or more of the memory components 112A to 112N can have multiple updateable trim profile tables 300 and/or individual profiles 114 in a given updatable trim profile table 300 can be stored in non-contiguous sections of memory. The trim register modifying component 118 can receive multiple start addresses (e.g., from USTP 113 or another operation) if, for example, multiple sets of updatable trim profiles 114 and/or multiple trim profile tables 300 need to be processed. The trim register modifying component 118 can also receive multiple stop actions to indicate that a set of updatable trim profiles 114 and/or a table 300 has been processed.

Figure 4:
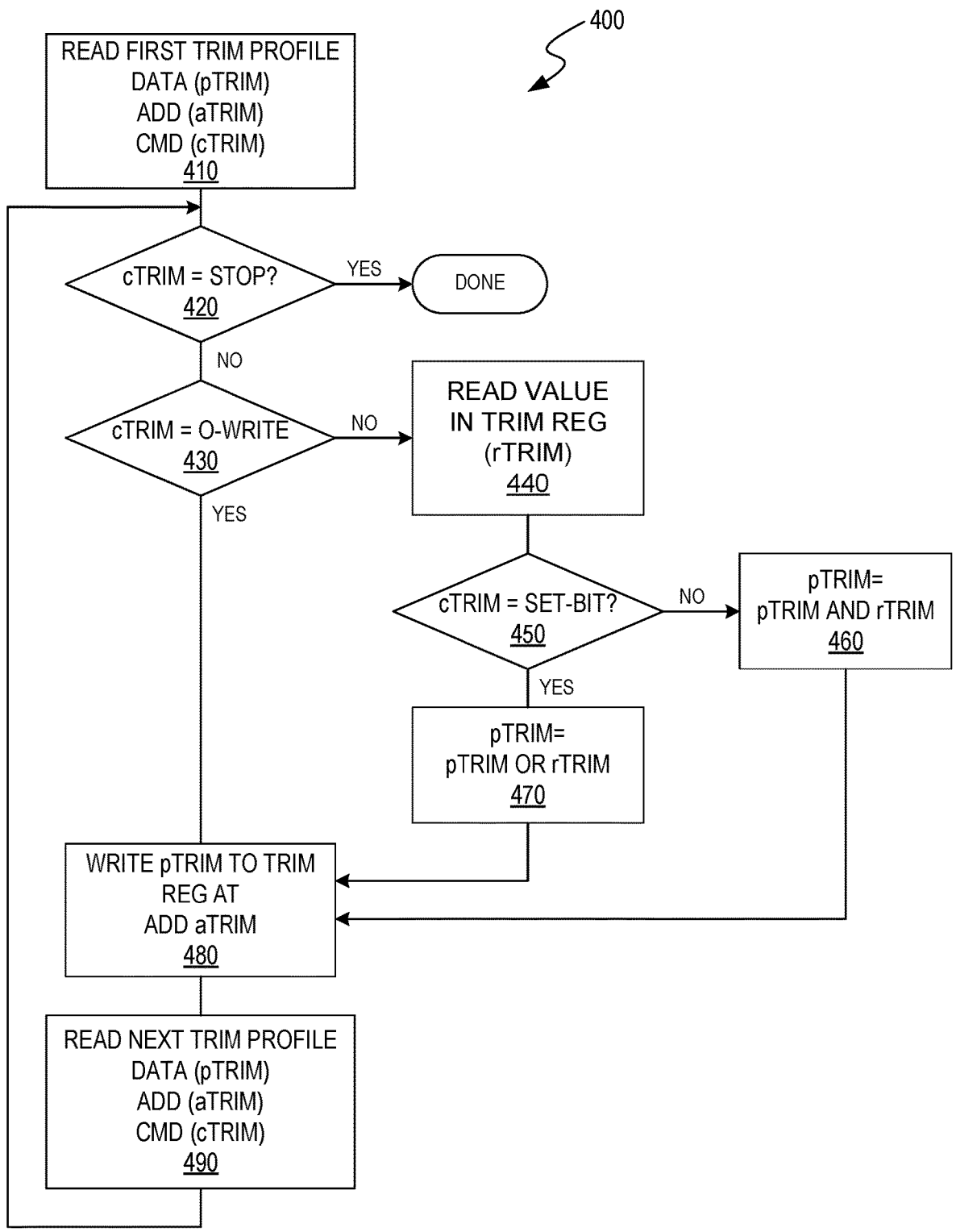
FIG. 4 is a flow diagram of an example method to modify trim registers in a memory component.

An example trim profile operation that can be executed by, for example, trim register modifying component 118, is shown in FIG. 4. FIG. 4 is a flow diagram illustrating example method 400 for managing the modification of one or more trim registers in the memory sub-system 110 using an updatable trim profile data-structure, such as, for example, updatable trim profile table 300. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the USTP component 113 or another operation can request the trim register modifying component 118 in one or more memory components 112A to 112N to perform the method 400. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, trim profile operation, performed by, for example, trim register modifying component 118, reads the first updatable trim profile (e.g., updatable trim profile 114) of user-selectable trim data-structure (e.g., updateable trim profile table 300). The first updatable profile (e.g., updatable trim profile 114) includes the address aTRIM (e.g., address 320) of the trim register to be modified (e.g., upper address 320A and lower address 320B of the trim register), the command cTRIM (e.g., command 330) corresponding to the action to be performed on the trim register to be modified, and the profile data pTRIM (e.g., data 340) to be used by the command cTRIM (e.g., command 330) when modifying the trim register at address aTRIM (e.g., address 320).

At block 420, the trim profile operation checks to see if the command cTRIM (e.g., command 330) is a command to stop the trim profile operation. If yes at block 420, trim profile operation can stop the current trim profile operation. If more than one trim profile operation has been requested, the trim register modifying component 118 can start the next trim profile operation. If all trim profile operations for the trim register modifying component 118 are completed, the trim register modifying component 118 can transfer control to, for example, USTP component 113 or another operation. In some embodiments, when control is transferred back, the trim register modifying component 118 can provide status information for the trim profile operation, such as, for example, an error count with respect to read and/or program errors when performing read and/or write operations.

If no at block 420, then at block 430, the trim profile operation determines if the command cTRIM (e.g., command 330) is a command to overwrite the trim register. If yes at block 430, then at block 480, the trim profile operation overwrites the contents of the trim register at address aTRIM (e.g., address 320) with the profile data pTRIM (e.g., data 340). If no at block 430, then at block 440, the trim profile operation reads the value rTRIM in the trim register to be modified based on the address aTRIM.

At block 450, the trim profile operation determines whether the command cTRIM (e.g., command 330) is a command to set one or more bits of the contents of trim register at address aTRIM (e.g., address 320). If the result of the set-bit check is a yes, at block 470, the trim profile operation performs a bit-wise OR operation with the contents of the trim register to be modified at address aTRIM (e.g., address 320) and a value corresponding to the bit to be set pTRIM (e.g., data 340). For example, to ensure that bit 3 (starting at bit 0) of the trim register at address aTRIM (e.g., address 320) is set, the memory component can perform a logical OR bitwise operation using a pTRIM (e.g., data 340) having a value that is "00001000" and rTRIM. At block 480, the resultant logical OR operation value is used to overwrite the value in the trim register to be modified at address aTRIM (e.g., address 320).

If the result of the set-bit check at block 450 is a no, then at block 460, the trim profile operation resets a desired bit in the trim register by performing a bit-wise logical AND operation with the contents of the trim register to be modified at address aTRIM (e.g., address 320) and a value corresponding to the bit to be reset pTRIM (e.g., data 340). For example, to ensure that bit 3 (starting at bit 0) of the trim register at address aTRIM (e.g., address 320) is reset, the memory component can perform a logical AND bitwise operation using a pTRIM (340) having a value that is "11110111" and rTRIM. At block 480, the resultant AND operation value is then used to overwrite the value in the trim register to be modified at address aTRIM (e.g., address 320).

At block 490, the trim profile operation reads the next trim profile in the user-selectable trim profile data-structure (e.g., updateable trim profile table 300). The trim profile operation then loops back to block 420 and the repeats the method 400 until a stop command is received.

In some embodiments, one or more of the memory component 112A to 112N can each have one or more updatable trim profile tables 300. In some embodiments, the updatable trim profile table 300 can be stored in one or more pages of the memory components 112A to 112N. The updatable trim profile table 300 can be stored in SLC memory, MLC memory, TLC memory, QLC memory, etc. Depending on the type of memory (e.g., SLC, MLC, TLC, QLC) the updatable trim profile can have error protection for data reliability, such as for example, four-times copy redundancy (also referred to herein as "XOR redundancy protection") and/or ECC.

In some embodiments, such as, for example, when the updatable trim profile table 300 is stored in SLC memory, the updatable trim profile table 300 can have XOR redundancy protection. The XOR redundancy protection is less resource intensive than ECC and thus can be efficient depending on the memory type. In XOR redundancy protection, each updatable trim profile 114 can have four instances in the updatable trim profile table 300. In the first instance of the updatable trim profile 114, the data bits can be written (programmed) into the memory component 112A to 112N without inversion of the bits. The second instance of the updatable trim profile 114 is programmed into the memory component 112A to 112N with all the bits inverted (NOT-copied). The third instance of the updatable trim profile 114 is similar to the first instance and the bits of the updatable trim profile 114 are copied without inversion. The fourth of the updatable trim profile 114 is similar to the second instance and the bits of the updatable trim profile 114 are NOT-copied. As part of the read operation by, for example, the trim profile operation of trim register modifying component 118, a four-times copy redundancy check can be performed. For example, the checks can include logical XOR the first and second copies (a result of 0xFF means the first and second copies are good), logical XOR the third and fourth copies (a result of 0xFF means the third and fourth copies are good), logical XOR the first and third copies (a result of 0x00 means the first and third copies are good), and logical XOR the second and fourth copy (a result of 0x00 means the second and fourth copies are good). If at least one of the checks is good, the trim profile operation of trim register modifying component 118 processes the updatable trim profile 114 as discussed above. If none of the checks are good, a byte by byte logical XOR operation must be performed to get the correct values. In some embodiments, information regarding the error protection checks (number of good reads, number of read errors, etc.) can be transmitted back to the USTP component 113 (or another operation), the controller 115, and/or the host system 120 for appropriate processing.

Figure 5:
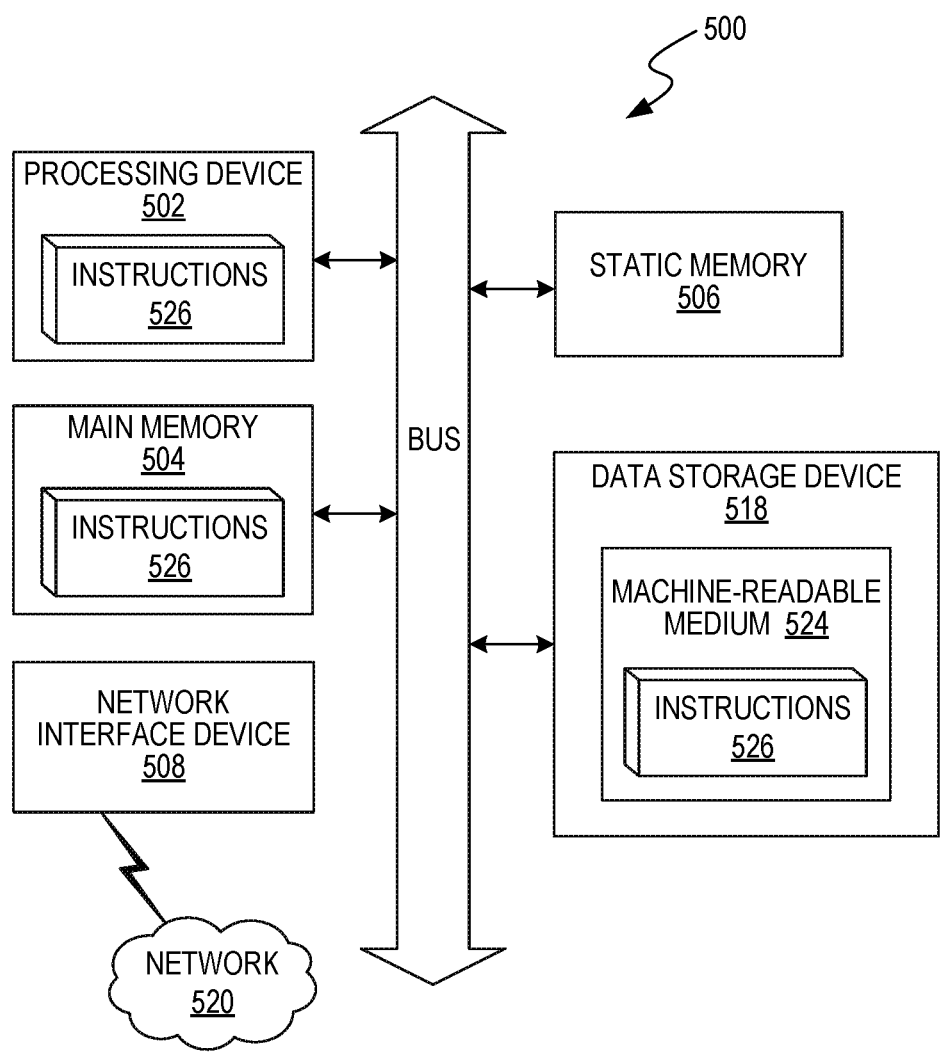
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the USTP component 113 and the trim register modifying component 118 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

Processing device 502 represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage device 518 can include a machine-readable storage medium 524 (also known as a computer-readable medium) on which is stored one or more sets of instructions or software 526 embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage device 518, and/or main memory 504 can correspond to the memory sub-system 110 of FIG. 1.

In one implementation, the instructions 526 include instructions to implement functionality corresponding to modifying trim registers (e.g., the USTP component 113 and the trim register modifying component 118 of FIG. 1). While the machine-readable storage medium 524 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

We claim:

1. A system, comprising:
 a memory component having:
  a memory comprising a memory cell array and configured to store an updatable trim profile that is user-modifiable in the memory cell array, the updatable trim profile including:
   address information corresponding to a trim register,
   command information corresponding to an action to be performed on the trim register, and
   data corresponding to the action to be performed on the trim register; and
  a processing device, coupled to the memory component, the processing device configured to:
   receive an instruction related to the trim register,
   read contents, including the address information, the command information, and the data, of the updatable trim profile, and
   process the action to be performed on the trim register based on the address information from the updatable trim profile and the data from the updatable trim profile.

2. The system of claim 1, wherein the action to be performed is one of
 overwriting the trim register with the data,
 setting one or more bits of the trim register based on the data,
 resetting one or more bits of the trim register based on the data, or
 stopping modification of the trim register.

3. The system of claim 1, wherein the instruction related to the trim register is received prior to in-service operation of the memory component.

4. The system of claim 1, wherein the instruction related to the trim register is received during in-service operation of the memory component.

5. The system of claim 1, wherein the memory is configured to store a plurality of updatable trim profiles, and
wherein the plurality of updatable trim profiles relate to a customized configuration of the memory component for a specific use.

6. The system of claim 5, wherein the plurality of updatable trim profiles are stored in a data-structure in the memory component.

7. The system of claim 5, wherein an update sequence of the plurality of updatable trim profiles, an update time of at least one updatable trim profile of the plurality of updatable trim profiles, or both the update sequence and the update time is controlled to optimize power on of the system.

8. A method, comprising:
receiving an instruction related to a trim register of a memory component of a memory sub-system;
reading contents of an updatable trim profile that is user-modifiable and stored in a memory cell array of a memory of the memory component, the updatable trim profile including:
address information corresponding to the trim register,
command information corresponding to an action to be performed on the trim register, and
data corresponding to the action to be performed on the trim register; and
processing the action to be performed on the trim register based on the address information from the updatable trim profile and the data from the updatable trim profile.

9. The method of claim 8, wherein the action to be performed is one of
overwriting the trim register with the data,
setting one or more bits of the trim register based on the data,
resetting one or more bits of the trim register based on the data, or
stopping modification of the trim register.

10. The method of claim 8, wherein the instruction related to the trim register is received prior to in-service operation of the memory component.

11. The method of claim 8, wherein the instruction related to the trim register is received during in-service operation of the memory component.

12. The method of claim 8, wherein the memory is configured to store a plurality of updatable trim profiles, and
wherein the plurality of updatable trim profiles relate to a customized configuration of the memory component for a specific use.

13. The method of claim 12, wherein the plurality of updatable trim profiles are stored in a data-structure in the memory component.

14. The method of claim 12, wherein an update sequence of the plurality of updatable trim profiles, an update time of at least one updatable trim profile of the plurality of updatable trim profiles, or both the update sequence and the update time is controlled to optimize power on of the system.

15. A non-transitory computer-readable storage medium comprising instructions that, when executed by a processing device, cause the processing device to:
receive an instruction related to a trim register of a memory component of a memory sub-system;
read contents of an updatable trim profile that is user-modifiable and stored in a memory cell array of a memory of the memory component, the updatable trim profile including:
address information corresponding to the trim register,
command information corresponding to an action to be performed on the trim register, and
data corresponding to the action to be performed on the trim register; and
process the action to be performed on the trim register based on the address information from the updatable trim profile and the data from the updatable trim profile.

16. The non-transitory computer-readable storage medium of claim 15, wherein the action to be performed is one of
overwriting the trim register with the data,
setting one or more bits of the trim register based on the data,
resetting one or more bits of the trim register based on the data, or
stopping modification of the trim register.

17. The non-transitory computer-readable storage medium of claim 15, wherein the instruction related to the trim register is received prior to in-service operation of the memory component.

18. The non-transitory computer-readable storage medium of claim 15, wherein the instruction related to the trim register is received during in-service operation of the memory component.

19. The non-transitory computer-readable storage medium of claim 15, wherein the memory is configured to store a plurality of updatable trim profiles, and
wherein the plurality of updatable trim profiles relate to a customized configuration of the memory component for a specific use.

20. The non-transitory computer-readable storage medium of claim 15, wherein an update sequence of the plurality of updatable trim profiles, an update time of at least one updatable trim profile of the plurality of updatable trim profiles, or both the update sequence and the update time is controlled to optimize power on of the system.

* * * * *